United States Patent [19]

Ramacher

[11] Patent Number: 5,233,235
[45] Date of Patent: Aug. 3, 1993

[54] ON-CHIP INTERMEDIATE DRIVER FOR DISCRETE WSI SYSTEMS

[75] Inventor: Ulrich Ramacher, Munich, Fed. Rep. of Germany

[73] Assignee: Siemens Aktiengesellschaft, Munich, Fed. Rep. of Germany

[21] Appl. No.: 921,425

[22] Filed: Jul. 28, 1992

Related U.S. Application Data

[63] Continuation of Ser. No. 646,795, Mar. 11, 1991, abandoned.

[30] Foreign Application Priority Data

Aug. 16, 1988 [DE] Fed. Rep. of Germany ....... 3827802

[51] Int. Cl.$^5$ ............................................... H02H 3/20
[52] U.S. Cl. ..................................... 307/303; 307/443; 307/451; 257/724; 257/701
[58] Field of Search ....................... 307/443, 451, 303; 357/75, 80

[56] References Cited

U.S. PATENT DOCUMENTS

| | | | |
|---|---|---|---|
| 4,239,981 | 12/1980 | Crookshanks | 307/214 |
| 4,709,172 | 11/1987 | Williams | 307/451 |
| 4,906,872 | 3/1990 | Tanaka | 307/303 |
| 4,954,730 | 9/1990 | Yoh | 307/451 |
| 4,962,341 | 10/1990 | Schoeff | 307/448 |
| 5,030,853 | 7/1991 | Vinal | 307/451 |
| 5,053,909 | 10/1991 | Suzuki et al. | 307/303 |

FOREIGN PATENT DOCUMENTS

0023118A1  1/1981  European Pat. Off. .

OTHER PUBLICATIONS

"The Trials of Wafer-Scale Integration", by J. F. McDonald et al., IEEE Spectrum, Oct. 1984, pp. 32-39.
"Datasheet: UM6502/UM6507/UM6512 8 bit Microprocessors", Apr. 1985, Herausgegeben: UMC, United Microelectronics, Corp. (Taipei, Taiwan, Republic of China) Seiten 1-12, Siehe Seiten 2-5, 9.

Primary Examiner—John S. Heyman
Assistant Examiner—Scott A. Ouellette
Attorney, Agent, or Firm—Hill, Steadman & Simpson

[57] ABSTRACT

In discrete wafer-scale integration abbreviated as WSI, pre-tested chips are mounted and bonded on a pre-wired wafer. Silicon usually serves as the wafer substrate because the wafer wiring can be cost-beneficially produced with a standard multi-layer process. The conducting properties of such a wafer micro-wiring forbid the use of long leads given high timing clocks, so that intermediate drivers must be utilized. Previous solutions make use of separate driver chips that must be placed, bonded and tested in addition to the actual function chips. In the disclosed WSI system, the intermediate drivers are not realized as separate chips but are implemented on the function chip itself.

5 Claims, 1 Drawing Sheet

ON-CHIP INTERMEDIATE DRIVER FOR DISCRETE WSI SYSTEMS

This is a continuation of application Ser. No. 646,795, filed Mar. 11, 1991, now abandoned.

BACKGROUND OF THE INVENTION

The concept of hybrid wafer-scale integration systems, also abbreviated as WSI, already derives from the 1960's. The concept is based on the idea of integrating individual chips on a wafer that itself is inherently pluggable. Since the individual chips thereby contain LSI circuits it is thus possible to manufacture specific high-performance modules for various possible uses.

The significance of WSI circuits for various areas of employment has been increasing with the assistance of new design, manufacturing and test technologies and with the increasing need for LSI circuits and modules. 4-megabyte WSI memories thus already exist for commercial purposes, these having been manufactured in Japan by NTT Musashino Electrical Comm. Lab. in Tokyo and serving the purpose of storing the entire Kanji alphabet. In addition to such a storing possibility, WSI circuits also offer the possibility of formatting extremely complex, customized modules. The advantages of the wafer-scale integration systems lie, first, therein that a desired circuit is more highly integratable, that the connections of the chips to one another ensue via shorter leads and that, further, a lower number of terminals need be conducted out of the wafer. These advantages enhance the reliability of the desired circuit.

In discrete wafer-scale integration, pre-tested chips are mounted and bonded on a pre-wired wafer. Silicon usually serves as wafer substrate because the wafer wiring can be cost-beneficially produced with a standard multi-layer process. The conducting properties of such a wafer wiring, however, forbid the use of long leads at high clocks, so that intermediate drivers must be utilized. A further point of view when designing WSI systems is the heat elimination of the overall wafer-scale-integration system wherein up to 1000 watts can be converted into heat.

FIG. 1 shows a solution of the prior art directed to the problem of long leads given high timing clocks for WSI systems. Separate driver chips are shown here, these being connected between the individual chips. In addition, the separate driver chips must be placed relative to the actual function chips, must be bonded and tested. This is also known from the literature in the publication IEEE Spectrum, October 1984, "The Trails of Wafer-Scale Integration" by Jack F. MacDonald et al., page 35, right-hand column through page 36, left-hand column, whereby the said publication also provides an overview of the development and of the prior art with respect to wafer scale integration systems.

The disadvantages of additional driver chips are comprised in an increased wiring outlay, an increased surface requirement of the overall circuit as well as in additional testing for the separate driver chips.

SUMMARY OF THE INVENTION

The object of the invention is to specify discrete wafer-scale integration systems that offer a simpler structure and an increased reliability than current systems of the prior art. In particular, the invention is intended to resolve the problem of longer leads given high clock rates for the WSI systems.

This object is inventively achieved by the fashioning of a wafer-scale integration system with an intermediate driver, whereby a wafer contains a plurality of chips that are at least partially connected to one another and are at least partially connected to inputs and outputs of the wafer via chip leads. Some chips of the plurality of chips contained on the wafer are equipped with intermediate drivers. The intermediate drivers are connected to the chip leads in order to amplify signals on the chip leads.

In further developments of the present invention an input of an intermediate driver is connected to an on-chip pad and the output thereof is connected to an additional pad on the chip. Inputs and outputs of an intermediate driver are connected via additional pads which are implemented on the chip. Given chips constructed in CMOS technology, the intermediate drivers are formed to two series-connected inverter stages. The two inverter stages each respectively contain a p-channel and an n-channel MOS field effect transistor. First terminals of the n-channel MOS field effect transistors of the first and second inverter stages are respectively connected to ground. First terminals of the p-channel MOS field effect transistors of the first and second inverter stages are respectively connected to the supply voltage. Gate terminals of the n-channel and p-channel MOS field effect transistors of the first inverter stage form an input of the intermediate driver. Second terminals of the n-channel and p-channel MOS field effect transistors of the first inverter stage are connected to one another and to a gate terminal of the p-channel and n-channel MOS field effect transistors of the second inverter stage. Second terminals of the p-channel and n-channel MOS field effect transistors of the second inverter stage are connected to one another and form an output of the intermediate driver.

In addition to the advantage of reduced electrical power consumption in comparison to an equivalent motherboard structure, the realization of the on-chip intermediate driver of the invention for wafer-scale integration systems is possible within any wiring substrate with the assistance of any chip technology. The 400 μm wide strips at one chip side need merely be provided for the chips for the additional implementation of the intermediate drivers, this strip being already available any way at most chips. When some of the chips are also to be employed as discrete modules, then it is not necessary to connect the inputs or, respectively, outputs of the intermediate driver to the external terminals of the module. These chips can thus be used both for discrete wafer-scale integration systems as well as for the employment of individual, integrated circuits.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, int he several Figures in which like reference numerals identify like elements, and in which:

DESCRIPTION OF THE PREFERRED EMBODIMENT

Figure 1:
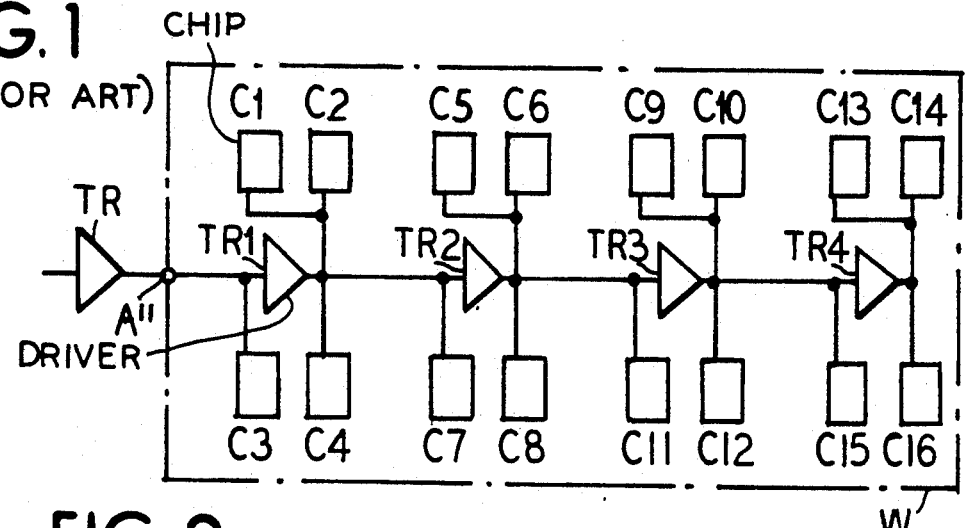
FIG. 1 depicts the employment of intermediate drivers in wafer-scale integration systems of the prior art.

FIG. 1 shows a WSI system of the prior art, whereby 16 individual chips Cl, C2, ... C15, C16 are glued on a wafer W and are connected to one another, partly via separate driver chips TR1, TR2, TR3 and TR4. The terminals are thereby bonded to the individual chips and the leads connected in this fashion connect the chips to one another as well as to the separate driver chips.

In detail in the exemplary WSI system of FIG. 1, the chips C1, C2, C4 and C7 as well as the input of the second, separate driver chip TR2 are connected to the output of the first driver chip TR1, the output of the second driver chip TR2 is in turn interconnected to the chip C5, C6, C8 and C11. At the same time, the output of the second driver chip TR2 is connected to the input of the third driver chip TR3 and the output of the third driver chip TR3 is wired to the chips C9, C10, C12 and C15. The output of the third driver chip TR3, further, is connected to the input of the fourth driver chip TR4, whereby the output of the latter is wired to the chips C13, C14 and C16. The input of the first driver chip TR1 together with the chip C3 is driven with the assistance of an external signal driver TR and is connected thereto via external terminal A" of the WSI system. The separate driver chips TR1, TR2, TR3 and TR4 thereby have the job of compensating the losses given excessively long leads from, for example, the terminal A" to the chips C13, C14 and C16 and of assuring a reliable functioning of the circuit. As was already initially set forth, however, these additional driver chips must be additionally applied on the wafer W, must be bonded and must be provided with leads, and these driver chips must also be subsequently tested.

Figure 2:
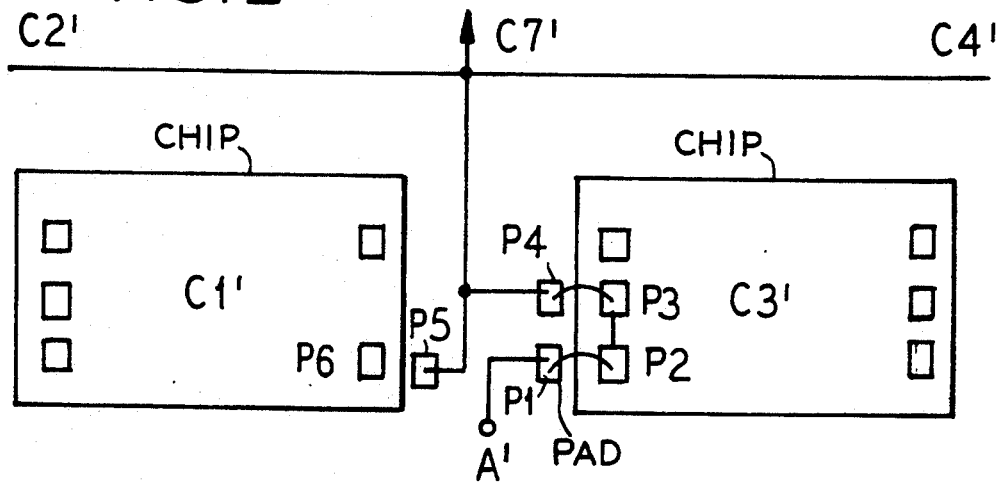
FIG. 2 depicts the inventive, on-chip realization of the intermediate drivers on individual chips.

FIG. 2 shows an on-chip realization of the intermediate drivers of the invention on the individual chips, whereby external driver chips as required in the realization of FIG. 1 are thereby eliminated. Only two chips C1' and C3' applied on a wafer (not shown) are shown in FIG. 2. The separate driver chip TR1 realized in FIG. 1 is thereby implemented within the chip C3'. In detail, FIG. 2 shows that the lead from the terminal A' of the WSI system is laid to a first wafer pad Pl, whereby an electrical lead from the latter ensues onto the pad P2 of the chip C3'. The electrical connection to the wafer pad Pl and to an additional pad P2 on the chip C3', for example, can thereby be bonded, whereby a continuing line leads to a second pad P3 on the chip C3'. The required intermediate driver that is intended to replace the separate driver chip TR1 of FIG. 1 is also accommodated in the region of the second pad P3. The pad P2 of the chip C3' can also be additionally utilized for input occupation of the C3' chip. The output of the implemented intermediate driver is connected to the wafer pad P4 via the pad P3. This electrical connection can likewise again be bonded. In terms of its further wiring, FIG. 2 corresponds to that in FIG. 1, so that the wafer pad P4 is connected to a wafer pad P5 which is interconnected to the pad P6 of the chip C1' via an electrical lead. In addition, the pad P4 is connected via leads to the chips C2', C4' and C7' that were not shown here for reasons of clarity. In addition to the said pads on the chips C1' and C3', further pads are shown on the chips that serve as inputs and outputs for the chips C1' and C3'.

Figure 3:
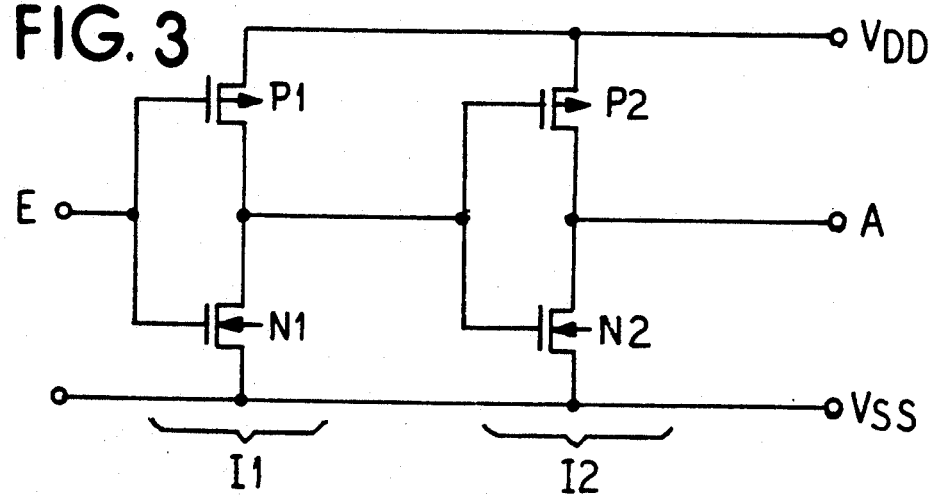
FIG. 3 depicts an exemplary realization of an intermediate driver in CMOS technology.

FIG. 3 shows an exemplary realization of an intermediate driver in CMOS technology in case the chip is constructed with the assistance of such a technology. Two series-connected inverter stages I1, I2 each of which contains a p-channel and an n-channel MOS field effect transistor are shown. A first terminal of the first n-channel MOS field effect transistor N1 of the first inverter stage I1 and a first terminal of the first n-channel MOS field effect transistor N2 of the second inverter stage I2 is thereby connected to the ground $V_{SS}$ and a first terminal of the p-channel MOS field effect transistor P1 of the first inverter stage I1 as well as a first terminal of the p-channel MOS field effect transistor P2 of the second inverter stage I2 is connected to the supply voltage $V_{DD}$. Together, the two gate terminals of the p-channel and n-channel field effect transistor P1 and N1 form the input E of the intermediate driver, whereas the second terminal of the p-channel and n-channel MOS field effect transistor P1 and N1 of the first inverter stage I1 is wired to the gate terminal of the p-channel MOS field effect transistor P2 and to the gate terminal of the n-channel MOS field effect transistor N2 of a second inverter stage I2. The output A of the intermediate driver is formed by the second terminal of the p-channel MOS field effect transistor P2 in common with the second terminal of the n-channel MOS field effect transistor N2 of the second inverter stage I2.

FIG. 2 and FIG. 3 thereby merely show an exemplary embodiment, whereby a realization is also conceivable in FIG. 2 wherein an implemented intermediate driver is merely additionally accommodated on the chip and is not itself in electrical communication therewith. The intermediate drivers thereby require only a strip that is approximately 400 $\mu$m wide on one chip side, that, for example, is available at any time in customized chips. A WSI system realized in this way is conceivable in any chip technology and in every wiring substrate. The intermediate driver realized in FIG. 3, however, assumes a chip in CMOS technology.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

I claim:

1. An intermediate driver apparatus for discrete wafer-scale integration systems in which a plurality of chips are mounted on a pre-wired wafer, the plurality of chips at least partially connected to one another via bonded chip leads and at least partially connected to inputs and outputs of the pre-wired wafer via bonded chip leads, comprising: at least one chip of the plurality of chips having a monolithically integrated large scale integration circuit and a monolithically integrated intermediate driver; the intermediate driver connected to at least one predetermined chip lead for the at least one chip of the plurality of chips in order to amplify signals on the predetermined chip lead.

2. The intermediate driver apparatus for discrete wafer-scale integration systems according to claim 1, wherein the predetermined chip lead is connected to a first on-chip pad on the at least one chip of the plurality of chips and wherein an input of the intermediate driver is connected to the first on-chip pad on the at lest one chip of the plurality of chips and an output thereof is connected to an additional on-chip pad on the at least one chip of the plurality of chips.

3. The intermediate driver apparatus for discrete wafer-scale integration systems according to claim 1, wherein inputs and outputs of the intermediate driver are connected to on-chip pads on the at least one chip of the plurality of chips.

4. The intermediate driver apparatus for discrete wafer-scale integration systems according to claim 1, wherein, the at least one chip of the plurality of chips is constructed in CMOS technology, and the intermediate driver is formed of two series-connected inverter stages.

5. The intermediate driver apparatus for discrete wafer-scale integration systems according to claim 4, wherein the two inverter stages each respectively contain a p-channel and an n-channel MOS field effect transistor; wherein first terminals of the n-channel MOS field effect transistors, of the first and second inverter stages are respectively connected to ground and first terminals of the p-channel MOS field effect transistors of the first and second inverter stages are respectively connected to a supply voltage; wherein gate terminals of the n-channel and p-channel MOS field effect transistors of the first inverter stage form an input of the intermediate driver; wherein second terminals of the n-channel and p-channel MOS field effect transistors of the first inverter stage are connected to one another and to gate terminals of the p-channel and n-channel MOS field effect transistors of the second inverter stage; wherein second terminals of the p-channel and n-channel MOS field effect transistors of the second inverter stage are connected to one another and form an output of the intermediate driver.

* * * * *